United States Patent
Yang et al.

(10) Patent No.: US 8,906,207 B2
(45) Date of Patent: Dec. 9, 2014

(54) CONTROL OF FILM COMPOSITION IN CO-SPUTTER DEPOSITION BY USING COLLIMATORS

(75) Inventors: Hong Sheng Yang, Pleasanton, CA (US); Chi-I Lang, Cupertino, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 427 days.

(21) Appl. No.: 13/081,042

(22) Filed: Apr. 6, 2011

(65) Prior Publication Data

US 2012/0258255 A1    Oct. 11, 2012

(51) Int. Cl.
*C23C 14/34* (2006.01)
*C23C 14/54* (2006.01)
*H01J 37/34* (2006.01)

(52) U.S. Cl.
CPC .............. *C23C 14/34* (2013.01); *C23C 14/54* (2013.01); *C23C 14/548* (2013.01); *H01J 37/3447* (2013.01)
USPC ................................ 204/192.12; 204/298.11

(58) Field of Classification Search
CPC ............................ C23C 14/54; H01J 37/3447
USPC ........................ 204/192.12, 298.11
See application file for complete search history.

(56) References Cited

U.S. PATENT DOCUMENTS

| | | | | |
|---|---|---|---|---|
| 4,290,876 A | * | 9/1981 | Nishiyama et al. | 204/298.13 |
| 5,409,587 A | * | 4/1995 | Sandhu et al. | 204/192.12 |
| 5,624,536 A | * | 4/1997 | Wada et al. | 204/298.11 |
| 5,985,102 A | | 11/1999 | Leiphart | |
| 6,143,149 A | * | 11/2000 | Abe | 204/298.26 |
| 6,290,826 B1 | * | 9/2001 | Obinata et al. | 204/298.28 |
| 6,506,290 B1 | * | 1/2003 | Ono | 204/298.11 |
| 7,297,642 B2 | | 11/2007 | Gao et al. | |
| 2009/0098717 A1 | | 4/2009 | Li et al. | |

OTHER PUBLICATIONS

Golovato, S., et al., "Collimated Physical Vapor Deposition for Through-Silicon Via Barrier-See Deposition", Chip Scale Review, Jan./Feb. 2010, pp. 18-21.

* cited by examiner

*Primary Examiner* — John Brayton

(57) ABSTRACT

The present disclosure includes a method for control of a film composition with co-sputter physical vapor deposition. In one implementation, the method includes: positioning first and second PVD guns above a substrate, selecting first and second collimators having first and second sets of physical characteristics, positioning the first and second collimators between the first and second PVD guns and the substrate, sputtering at least one material from the first and second PVD guns through the first and second collimators upon application of a first power and second power, wherein the first PVD gun has a first deposition rate from the first collimator at the first power, and the second PVD gun has a second deposition rate from the second collimator at the second power.

18 Claims, 6 Drawing Sheets

CONTROL OF FILM COMPOSITION IN CO-SPUTTER DEPOSITION BY USING COLLIMATORS

TECHNICAL FIELD

The present disclosure generally relates to the field of thin-film processing on a substrate and more particularly to methods and systems for controlling film composition in co-sputter deposition by using collimators.

BACKGROUND

The following descriptions and examples do not constitute an admission as prior art by virtue of their inclusion within this section.

Deposition processes are commonly used in semiconductor manufacturing to deposit a layer of material onto a substrate. Other processes are used to remove layers, define features (e.g., etch), prepare layers (e.g., clean) and dope elements. "Processes" shall be used throughout the application to refer to these and other possible known processes used for semiconductor manufacturing and any reference to a specific process should be read in the context of these other possible processes. In addition, deposition processes may apply to the manufacture of integrated circuits (IC) in semiconductor devices, flat panel displays, optoelectronic devices, data storage devices, magneto electronic devices, magneto optic devices, packaged devices, and the like. As integrated circuit sizes continue to shrink, improvements in materials, unit processes, and process sequences are continually being developed.

Thin film deposition is one method for manufacture of integrated circuits by depositing extremely thin layers of material on substrates or on previously existing layers. Sputter deposition is a physical vapor deposition (PVD) method of depositing thin films by ejecting (or sputtering) material from a target, which ejected material then deposits onto the substrate. Co-sputter deposition is a type of sputter deposition involving more than one PVD gun used to sputter target materials simultaneously to a substrate to provide a particular film composition (e.g., dopant level) on the substrate. Controlling dopant levels in current co-sputter deposition processes may involve using pre-doped targets in sputtering or co-sputtering processes and controlling process power applied to physical vapor deposition (PVD) guns. However, using multiple pre-doped targets to obtain a desired range of film compositions may be prohibitively expensive. Regarding control of process power, in general, providing a low process power results in a thin deposition film, whereas providing a high process power results in a thicker deposition film. However, it is undesirable to rely solely on process power control when attempting to provide a desired dopant level, particularly for very low dopant levels. If the process power is too low, plasma formation may not occur. If the process power is too high, the system may overheat, resulting in cracking or melting of PVD targets.

Collimated physical vapor deposition (i.e., use of a collimator for PVD applications) involves the placement of a single collimator between a target (i.e., the source of the sputtered material) and the substrate to ensure that sputtered atoms from the target arrive at the substrate at angles as close to a normal to substrate surface. Collimated PVD may be used to prevent substantially non-vertical target material flux from reaching a substrate by causing sputtered atoms from the target to impact with portions of the collimator. Such processes have been utilized to provide the seed required for electroplating to fill through-silicon vias (TSV), or improved step coverage of high-aspect-ratio device structures in general. Besides the use of pre-doped alloy targets, there is a need for precise control of film composition (including dopant levels) in co-sputter deposition techniques. Provided herein are systems and methods for control of film composition (including dopant levels) in co-sputter deposition by using collimators.

SUMMARY

The present disclosure includes systems and methods for control of film composition (including dopant levels) in co-sputter deposition by using collimators. In one implementation, a method for depositing at least one material on a substrate using physical vapor deposition includes: positioning a first physical vapor deposition gun above a first portion of a substrate, positioning a second physical vapor deposition gun above a second portion of the substrate, selecting a first collimator having a first set of physical characteristics, selecting a second collimator having a second set of physical characteristics, positioning the first collimator between the first physical vapor deposition gun and the first portion of the substrate, positioning the second collimator between the second physical vapor deposition gun and the second portion of the substrate, sputtering at least one material from the first physical vapor deposition gun through the first collimator to the substrate upon application of a first power to the first physical vapor deposition gun, and sputtering the at least one material from the second physical vapor deposition gun through the second collimator to the substrate upon application of a second power to the second physical vapor deposition gun, wherein the first physical vapor deposition gun deposits the at least one material at a first deposition rate from the first collimator at the first power, and the second physical vapor deposition gun deposits the at least one material at a second deposition rate from the second collimator at the second power.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

One or more implementations of various techniques for controlling the co-sputtered physical vapor deposition on a substrate will now be described in more detail with reference to FIGS. 1-7.

Figure 1:
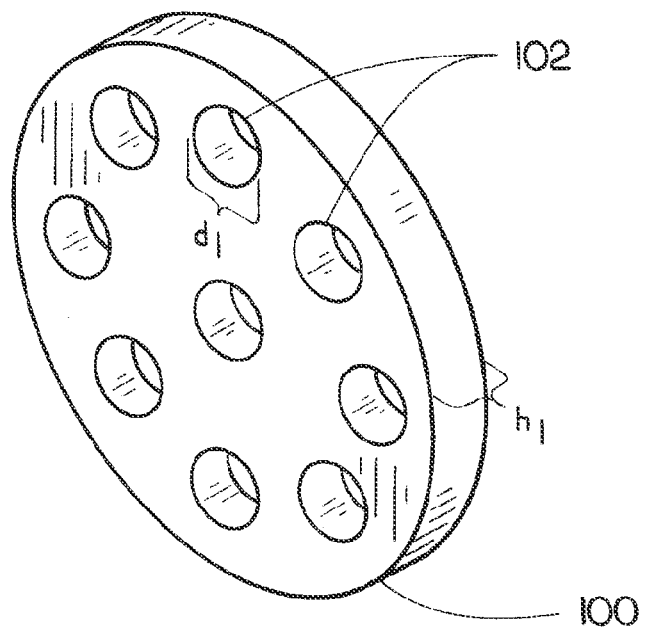
FIG. 1 is a schematic illustrating a collimator having a set of aperture characteristics.
Figure 2:
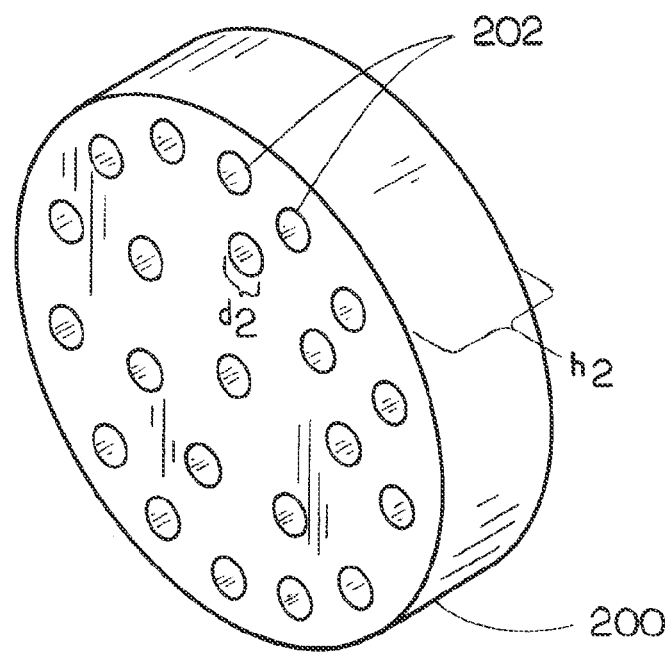
FIG. 2 is a schematic illustrating a collimator having another set of aperture characteristics different from the set of the collimator of FIG. 1.

The present disclosure includes systems and methods for control of film composition through co-sputter deposition by using collimators. Use of a separate collimator for each physical vapor deposition (PVD) gun in co-sputter deposition provides flexibility in order to control film composition (including dopant levels) for thin-film processing on a substrate. FIGS. 1 and 2 provide illustrative depictions of collimators (100, 200) having different aperture characteristics for control of a deposition rate from the respective collimators. Collimators used for co-sputter deposition processes may include different aperture configurations (e.g., number/size of apertures, aperture layout, etc.) than those depicted by the illustrative collimators (100, 200) in FIGS. 1 and 2. When a collimator is positioned between a target and a substrate, atoms sputtered from the target may interact with the collimator by passing through the collimator or by impacting with a portion of the collimator. The height (h) of a collimator is one contributing factor to the potential for a sputtered atom to impact with the collimator. The greater the height of a collimator, the greater the likelihood that a sputtered atom not travelling in parallel to the sidewalls of the apertures will create an impact with the collimator. Other factors include, but are not limited to, number/size of apertures, aperture layout, aperture shape, aspect ratio, texture, etc. Collimator 100 includes apertures 102 which are wider (e.g., $d_1 > d_2$) and shorter (e.g., $h_1 < h_2$) than the apertures 202 of collimator 200. As a result, the apertures 102 may provide less potential for impact with sputtered atoms than apertures 202. When collimators 100 and 200 are subject to the same process conditions (e.g., same power level applied to a PVD gun under which the collimator is placed; and same sputter material), the deposition rate of the sputter material from collimator 100 may be higher than the deposition rate of the sputter material from collimator 200. As will be described below, a specified deposition rate of material for each PVD gun of a co-sputter deposition process may be achieved by selecting a respective collimator for placement between a respective PVD gun and the substrate. Each collimator may have the same or different physical characteristics to provide a desired deposition rate from each PVD gun, providing flexibility in achieving film composition and/or a desired dopant level on the substrate.

Figure 3:
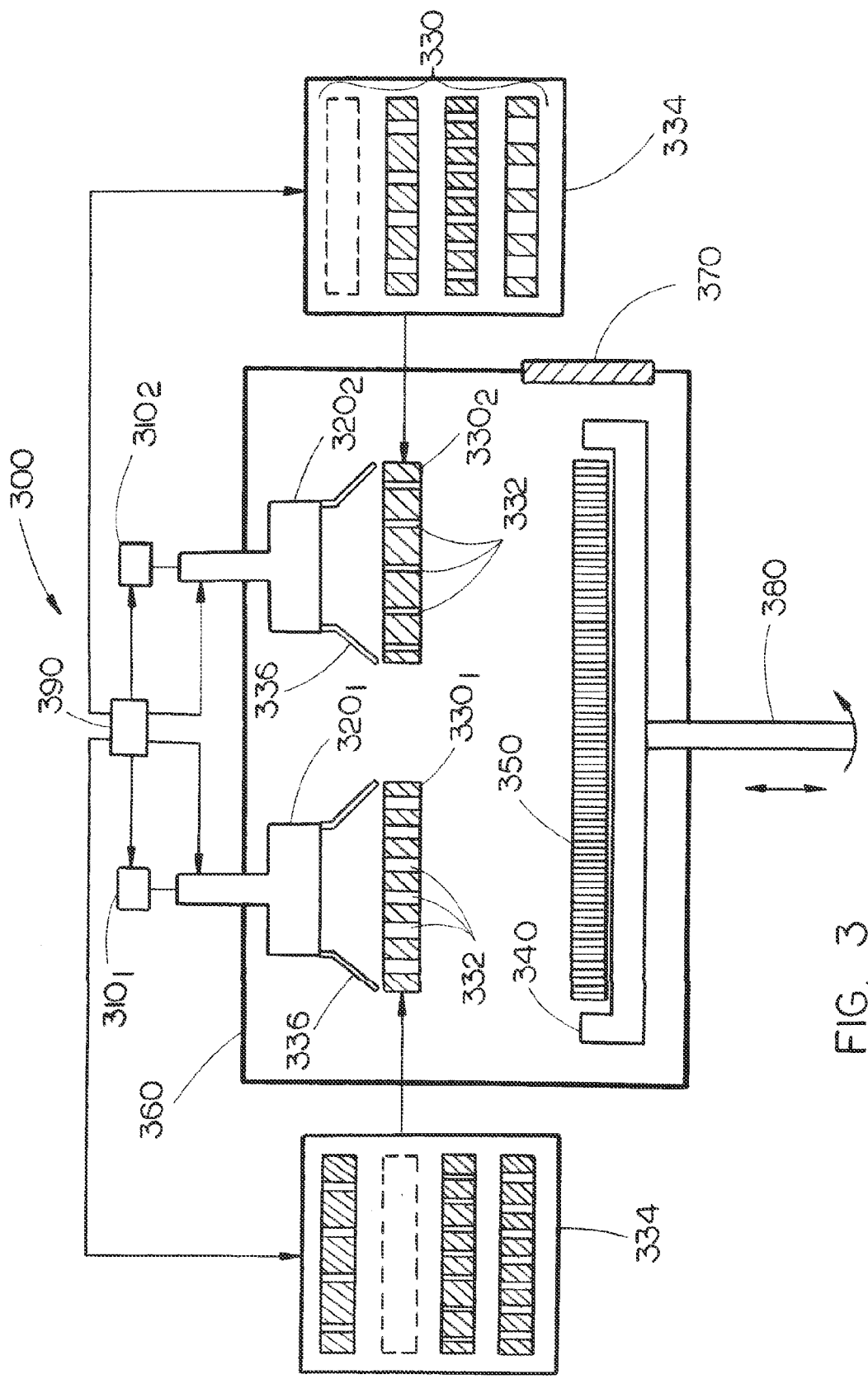
FIG. 3 illustrates a simplified schematic diagram of a system with a reaction chamber in which various technologies may be incorporated and used in accordance with various techniques described herein.

Referring now to FIG. 3, a simplified schematic diagram of a reaction chamber in a deposition system 300 is shown. In one implementation, the system 300 may include power sources 310, two or more Physical Vapor Deposition (PVD) guns 320, two or more collimators 330, a substrate support 340, a substrate 350, a reaction chamber 360, a chamber door 370, an axle 380 and a controller 390.

The substrate 350 may be a semiconductor wafer, a portion of a semiconductor wafer, solar photovoltaic circuitry, or other substrate. The substrate 350 may be placed in the substrate support 340 while in the reaction chamber 360. The substrate support 340 may be any device on which various processes may be performed, such as an electrostatic chuck or other type of pedestal capable of holding the substrate 350. In one implementation, the substrate support 340 may be referred to as a carrier plate, susceptor, or pedestal.

The axle 380 may be coupled to the substrate support 340. In one implementation, the axle 380 may be capable of moving the substrate support 340 in the upward or downward direction. The axle 380 may also be able to rotate the substrate support 340.

The substrate support 340 may be positioned inside the reactor chamber 360. In one implementation, the reactor chamber 360 may include plasma shields that may keep plasma contained within the shields of reactor chamber 360. The chamber door 370 may provide access to the substrate 350 or the substrate support 340. In one implementation, the chamber door 370 is a slit valve opening for loading and unloading the substrate 350.

The PVD guns 320 may be placed above the substrate 350 in order to perform a co-sputtered physical vapor deposition. The PVD guns 320 include a target having a material such as a chemical element, a chemical compound, a chemical alloy, or combinations thereof that may be sputtered for depositing a film or multiple layers of films on the substrate 350. In particular implementations, the targets may be pure targets, pre-doped targets, and the like. Although the system 300 is illustrated in FIG. 3 as having two PVD guns 320 installed thereon, it should be understood that the system 300 may include a plurality (i.e., two or more) of PVD guns. In one implementation, the PVD guns 320 may be configured to be tilted, oriented, etc. in any direction, depending on the desired application. For instance, the PVD guns may have four degrees of freedom of movement: rotation, tilting, radial offset from the reaction chamber center, and Z-direction (i.e., normal to the substrate surface) movement.

Each PVD gun 320 may have a collimator 330 positioned between the PVD gun 320 and the substrate 350 to influence one or more factors of the deposition of materials on the substrate during the PVD process by causing the collimator 330 to permit passage of a portion of the sputtered target material to the substrate 350 while preventing or hindering passage of another portion of the sputtered target material to the substrate 350. Such factors may include deposition rate, power requirements, and the like. As shown in FIG. 3, collimator $330_1$ is positioned between PVD gun $320_1$ and the substrate 350, whereas collimator $330_2$ is positioned between PVD gun $320_2$ and the substrate 350. As with each PVD gun 320, each collimator 330 may be configured to be tilted, oriented, etc. in any direction, depending on the desired application. The system 300 may include a plurality of collimators 334 from which a particular collimator having a particular set of physical characteristics is selected for positioning between a PVD gun and the substrate. By positioning the collimator having the particular set of physical characteristics (e.g., aperture size, shape, aspect ratio, texture, and the like) between the sputter target and the substrate 350, a deposition rate of the corresponding target may be controlled. For instance, the collimator 330 may define a plurality of apertures 332 or holes which penetrate the collimator structure and provide a path through which sputtered material may pass to the substrate 350 positioned beneath the collimator 330. The apertures 332 may also prevent or hinder material from the target by causing the material from the target to impact with an exposed portion of the collimator, such as the top surface of collimator 330 and interior surfaces of apertures 332. A collimator have a particular aperture size may be selected based on a desired deposition rate. For instance, smaller and/or taller apertures may provide increased blocking of material from the PVD gun 320 to the substrate 350. In a particular implementation, the aperture diameter may be between approximately 2 mm and 200 mm. Similarly, a collimator having a particular aspect ratio (e.g., the ratio of the height of the aperture to the width of the aperture) may be selected based on a desired deposition rate. For instance, a collimator 330 with a higher aspect ratio may provide increased blocking of material than a collimator 330 with a lower aspect ratio. In a particular implementation, the aspect ratio is between approximately 0.2 and 20.

System 300 may select a particular collimator 330 from a plurality of available collimators 334 for placement under a PVD gun 320. The selected collimator 330 may be positioned beneath the PVD gun 320 by a pneumatic valve or other suitable apparatus. As shown in FIG. 3, the controller 390 may control the selection and/or placement of a collimator 330 from the plurality of available collimators 334. Each collimator 330 from the plurality of collimators 334 may include a set of physical characteristics which differs from the other collimators from the plurality of collimators 334. For instance, collimator $330_1$ has different aperture sizes than collimator $330_2$, thereby providing potentially different deposition rates depending on the power applied to each PVD gun ($320_1$, $320_2$). It is contemplated that two selected collimators may have the same set of physical characteristics. Each selected collimator 330 may include a particular aperture pattern, orientation, and texture, where the selection of a collimator may vary depending upon process parameters including power supply, deposition rate, desired film thickness, and the like. For instance, the selected collimator 330 may include a symmetrical aperture pattern, an asymmetrical aperture pattern, a pattern with consistent aperture sizes and shapes, a pattern with varying aperture sizes and shapes, and the like. The selected collimator 330 may also include a particular texture, such as a texture of an interior surface of an aperture 332 or an exterior surface of the collimator 330. The texture may be selected to obstruct passage (e.g., rough or irregular texture) or enhance passage (e.g., a smooth texture) of the sputtered material passing through the collimator 330. Generally, the distance between each collimator 330 and the substrate 350 should be sufficient to prevent a shape or pattern of the collimator 330 from being copied onto contour maps of film thickness distribution on the substrate 350. In particular implementations, that distance is between approximately 20 mm to 600 mm. Additionally, each collimator 330 should be positioned far enough from the target, such as between approximately 20 mm to 400 mm, to allow stable plasma in front of the target (e.g., between the target and the collimator).

In a particular implementation, the controller 390 may be configured to control the movement of at least a portion of each selected collimator 330 from the path between the PVD gun 320 and the substrate 350. For instance, a portion of, or the entirety of, the collimator 330 may be removed from the path between the PVD gun 320 and the substrate 350. By controlling the movement of the collimator 330, at least a portion of the collimator 330 may be moved out of a path between the PVD gun 320 and the substrate 350 in situ, such that the sputter deposition rate may be controlled between an obstructed rate and an unobstructed rate.

Figure 5:
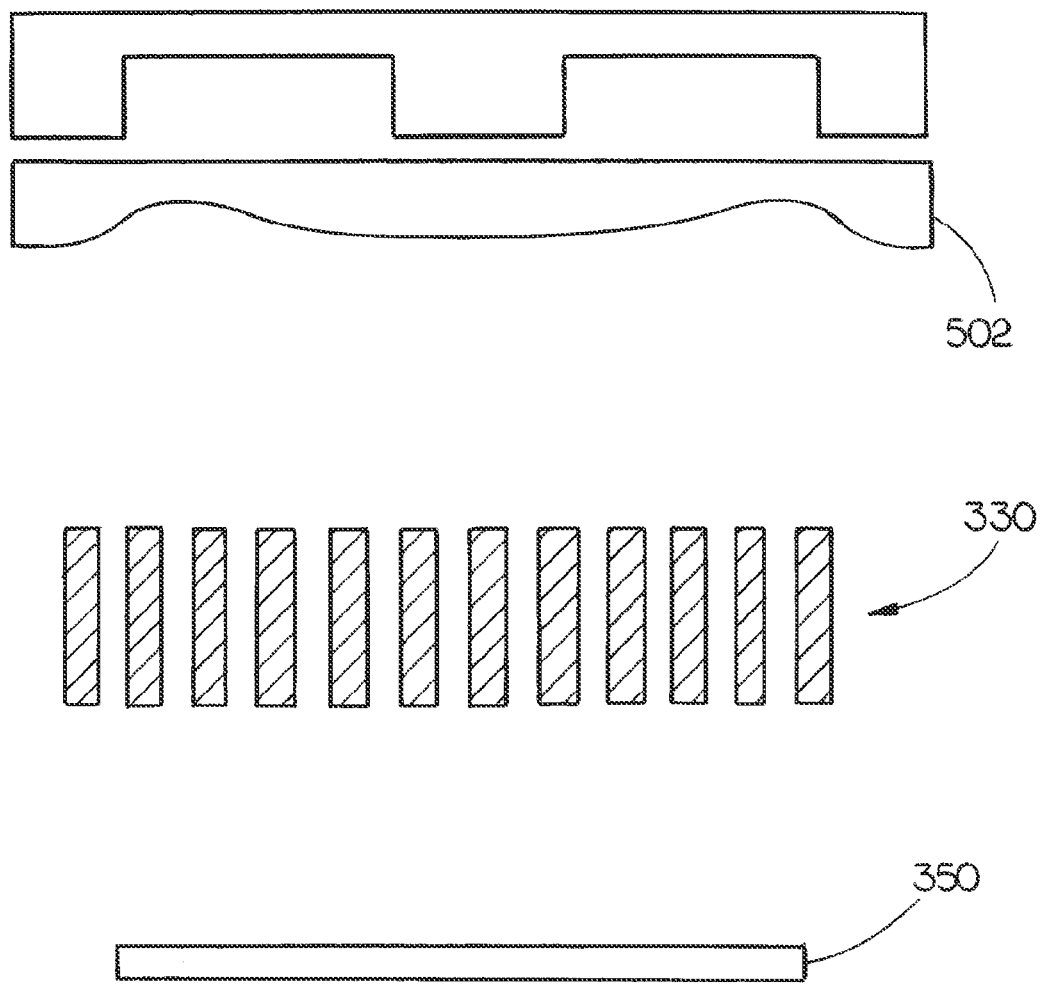
FIG. 5 illustrates a simplified schematic diagram of a collimator positioned beneath a sputtering source and above a substrate.
Figure 6:
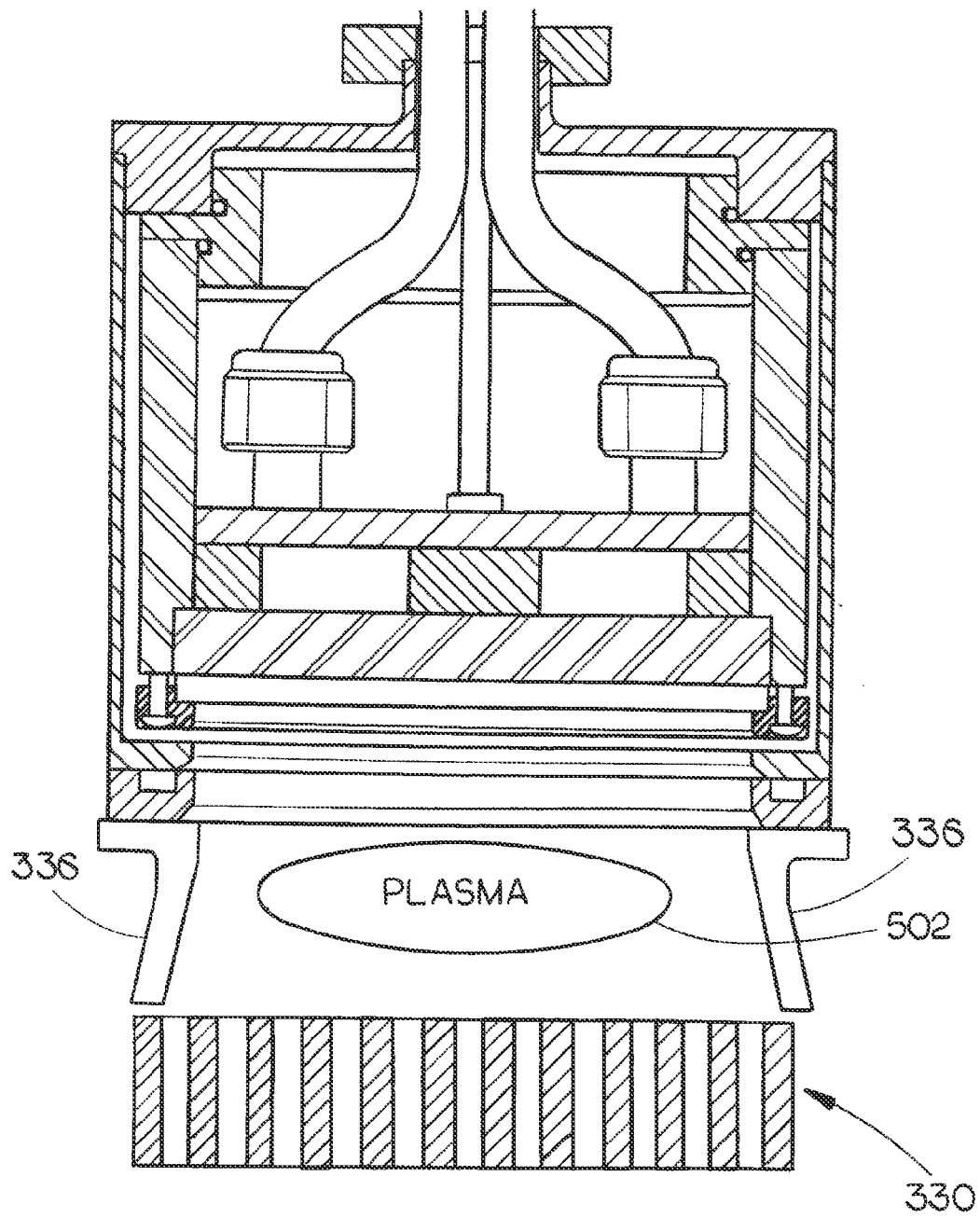
FIG. 6 illustrates a cross-sectional view of a physical vapor deposition gun with an associated collimator and shield.

Control of the deposition rate may allow for a reduction in the deposition rate without compromising the stability of the plasma 502 (FIGS. 5, 6). For instance, a power level sufficient to strike plasma may be utilized in conjunction with a collimator selected to reduce the deposition rate of the sputtered material as compared to the deposition rate of sputtered material with no collimator utilized. In particular, as shown in FIG. 3, each PVD gun 320 may be connected to a power source 310 to provide a predetermined amount of power to the PVD gun 320. The level of power provided to a gun may depend on the target of the gun, and may include a range of between approximately 50 W to 60 kW. In one implementation, the amount of power provided to the PVD gun 320 may be controlled by the controller 390. A very low doping level (e.g., as low as 0.1% or lower of target material deposited onto a substrate) by co-sputtering may be achieved at a relatively high process power in conjunction with collimators as compared to a process power level for a sputter system without collimators. For example, the power level for a physical deposition gun used in conjunction with collimators may include a range of between approximately 50 W to 60 kW. However, a higher power level may be utilized with certain targets, including ductile and heat-conductive targets. The high process power level with use of collimators may effectively reduce the process deposition rate to achieve a desired dopant level and/or film composition.

The controller 390 may also control the PVD guns 320, the collimator 330, and the axle 380. For instance, the controller 390 may control the angle at which the PVD gun 320 may be directed at the substrate 350. The controller 390 may also control the positioning of the collimator 330 with respect to the PVD gun 320 and/or the substrate 350.

In particular implementations, each PVD gun 320 may include a shield 336 coupled to and/or positioned beneath the PVD gun 320 and above the collimator 330. The shield 336 may prevent cross-contamination of sputtered material between each PVD gun, such that the sputtered material impacts the shield 336 instead of being allowed to be deposited on the target of another PVD gun.

Figure 4:
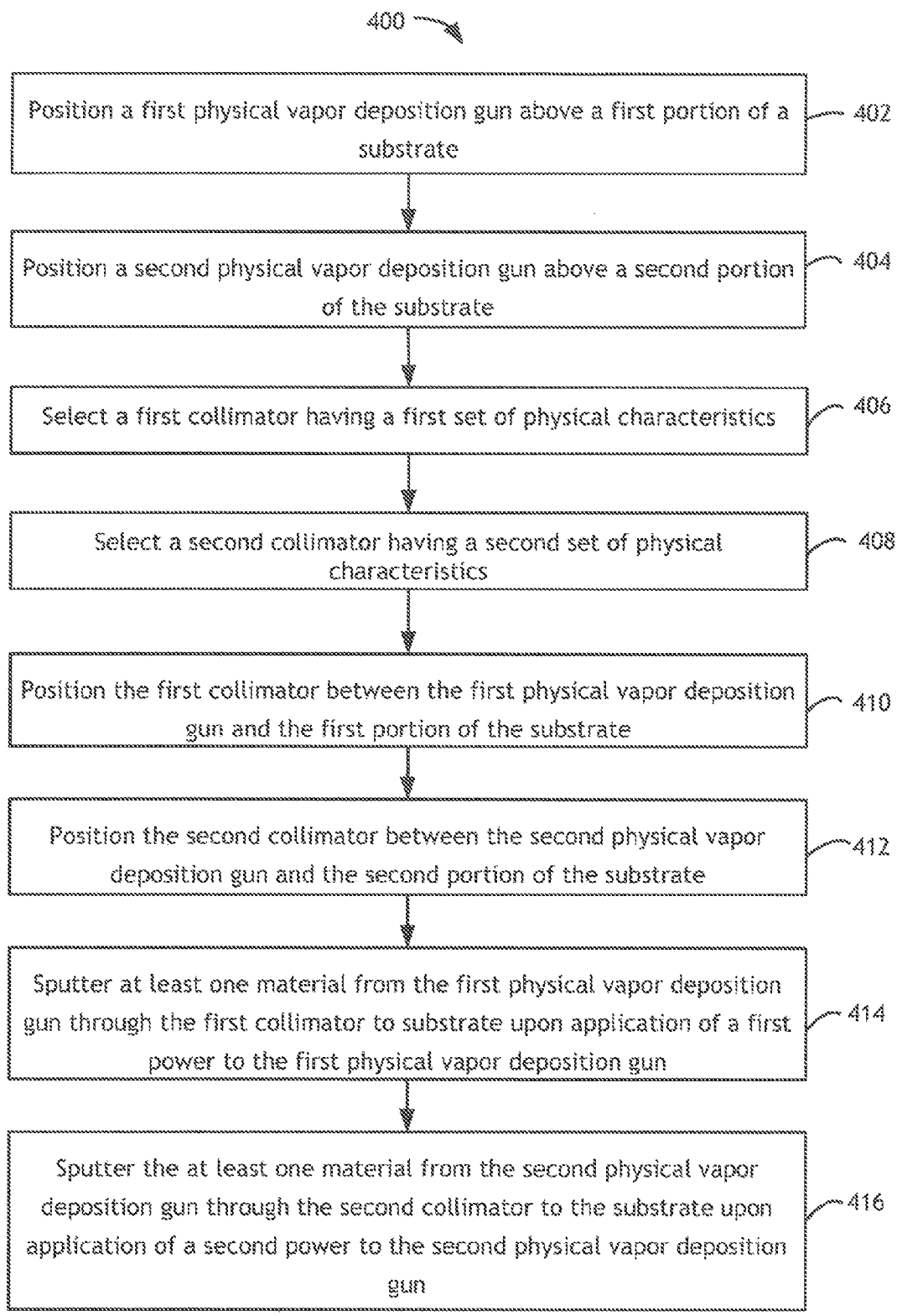
FIG. 4 illustrates a flow diagram of a method for control of film composition with physical vapor deposition in accordance with one or more implementations of various techniques described herein.

FIG. 4 illustrates a flow diagram of a method 400 for control of film composition with physical vapor deposition in accordance with one or more implementations of various techniques described herein. The following description of the method 400 is made with reference to FIG. 3 which was described above. Additionally, it should be understood that while the operational method 400 indicates a particular order of execution of the operations, in some implementations, certain portions of the operations might be executed in a different order. In one implementation, the method 400 may be performed by the controller 390.

Method 400 includes positioning a first physical vapor deposition gun above a substrate, 402, and positioning a second physical vapor deposition gun above the substrate, 404. For instance, PVD gun $320_1$ and PVD gun $320_2$ are each positioned above substrate 350. Method 400 also includes selecting a first collimator having a first set of physical characteristics, 406, and selecting a second collimator having a second set of physical characteristics, 408. For instance, collimator $330_1$ may be selected from the plurality of available collimators 334 and has a first set of physical characteristics corresponding to aperture 332 size, position, texture, etc. Collimator $330_2$ may be selected from the plurality of available collimators 334 and has a second set of physical characteristics corresponding to aperture 332 size, position, texture, etc.

Method 400 also includes positioning the first collimator between the first physical vapor deposition gun and the substrate, 410, and positioning the second collimator between the second physical vapor deposition gun and the substrate, 412. For instance, collimator $330_1$ is positioned between PVD gun $320_1$ and the substrate 350, whereas collimator $330_2$ is positioned between PVD gun $320_2$ and the substrate 350. Method 400 also includes sputtering at least one material from the first physical vapor deposition gun through the first collimator to the substrate upon application of a first power to the first physical vapor deposition gun, 414. For instance, a target material is sputtered from the PVD gun $320_1$ through collimator $330_1$ to the substrate 350 upon application of power by the power source $310_1$. Method 400 further includes sputtering the at least one material from the second physical vapor deposition gun through the second collimator to the substrate upon application of a second power to the second physical vapor deposition gun, 416. For instance, a target material is sputtered from the PVD gun $320_2$ through collimator $330_2$ to the substrate 350 upon application of power by the power source $310_2$. The method 400 permits control of a film composition and/or dopant level on the substrate 450 by depositing the at least one material at a first deposition rate from the first collimator at the first power and by depositing the at least one material at a second deposition rate from the second collimator at the second power.

Figure 7:
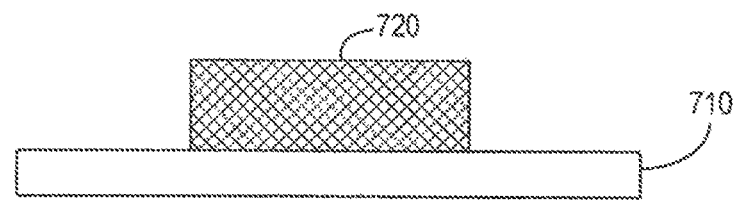
FIG. 7 illustrates schematic diagram of a substrate with film deposited on the substrate according to implementations of various techniques described herein.

FIG. 7 illustrates schematic diagram 700 of a substrate with film deposited on the substrate according to implementations of various techniques described herein. The following description of the schematic diagram 700 is made with reference to FIGS. 3, 5, and 6 in accordance with one or more implementations of various techniques described herein. The substrate 710 may include the deposited film 720 that may exist on an isolated region of the substrate 710. The deposited film 720 may have resulted from the deposition of two or more chemicals from the PVD guns 320 with the collimators 330 according to FIGS. 3, 5, and 6.

The systems and methods described herein may be incorporated as part of a high productivity combinatorial (HPC) deposition system. Further details of such HPC systems are described in U.S. application Ser. Nos. 11/672,478 and 11/672,473, which are incorporated herein by reference. Using an HPC system, a plurality of methods may be employed to deposit material upon a substrate employing combinatorial processes.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for depositing at least one material on a substrate using physical vapor deposition, the method comprising:
    positioning a first physical vapor deposition gun above a first portion of a substrate;
    positioning a second physical vapor deposition gun above a second portion of the substrate, wherein the first portion of the substrate and the second portion of the substrate are external to each other;
    selecting a first collimator having a first set of physical characteristics;
    selecting a second collimator having a second set of physical characteristics, the second set of physical characteristics being different than the first set of physical characteristics, wherein the first set of physical characteristics and the second set of physical characteristics comprise at least one of an aspect ratio, an aperture size, an aperture shape, and a texture;
    positioning the first collimator between the first physical vapor deposition gun and the first portion of the substrate;
    positioning the second collimator between the second physical vapor deposition gun and the second portion of the substrate;
    sputtering the at least one material from the first physical vapor deposition gun through the first collimator onto the first portion of the substrate upon application of a first power to the first physical vapor deposition gun; and
    sputtering the at least one material from the second physical vapor deposition gun through the second collimator onto the second portion of the substrate upon application of a second power to the second physical vapor deposition gun, wherein the sputtering of the at least one material from the second physical vapor deposition gun occurs simultaneously with the sputtering of the at least one material from the first physical vapor deposition gun,
    wherein the first physical vapor deposition gun deposits the at least one material at a first deposition rate from the first collimator at the first power, and the second physical vapor deposition gun deposits the at least one material at a second deposition rate from the second collimator at the second power.

2. The method of claim 1, wherein the first collimator and the second collimator are positioned such that the first collimator and the second collimator are external to each other.

3. The method of claim 1, further comprising sputtering the at least one material from the first physical vapor deposition gun through the first collimator to the substrate at a third deposition rate upon application of a third power to the first physical vapor deposition gun, wherein the third power is at least one of greater than or less than the first power, wherein the third deposition rate is greater than the first deposition rate when the third power is greater than the first power, and wherein the third deposition rate is less than the first deposition rate when the third power is less than the first power.

4. The method of claim 1, further comprising:
    removing the first collimator out of a path between the first physical vapor deposition gun and the substrate; and
    selecting a third collimator having a third set of physical characteristics, wherein the third set of physical characteristics differs from the first set of physical characteristics, and wherein a deposition rate from the third collimator differs from the first deposition rate.

5. The method of claim 1, wherein the first set of physical characteristics and the second set of physical characteristics comprise the aspect ratio and the aspect ratio of the first collimator and the second collimator is between approximately 0.2 and 20.

6. The method of claim 1, wherein the first set of physical characteristics and the second set of physical characteristics comprise the aperture size and the aperture size of the first collimator and the second collimator includes a diameter of between approximately 2 mm and 200 mm.

7. The method of claim 1, further comprising positioning at least one of the first collimator or the second collimator between approximately 20 mm to 600 mm above the substrate.

8. The method of claim 1, further comprising positioning a shield between the first physical vapor deposition gun and the first collimator, positioning a shield between the second physical vapor deposition gun and the second collimator, or a combination thereof.

9. A method for depositing at least one material on a substrate using physical vapor deposition, the method comprising:
- positioning a first physical vapor deposition gun above a first portion of a substrate;
- positioning a second physical vapor deposition gun above a second portion of the substrate;
- selecting a first collimator having a first set of physical characteristics;
- selecting a second collimator having a second set of physical characteristics, the second set of physical characteristics being different than the first set of physical characteristics, wherein the first set of physical characteristics and the second set of physical characteristics comprise at least one of an aspect ratio, an aperture size, an aperture shape, and a texture;
- positioning the first collimator beneath a target of the first physical vapor deposition gun and above the first portion of the substrate, the first collimator positioned beneath the target of the first physical vapor deposition gun to provide a region for formation of stable plasma between the target and the first collimator;
- positioning the second collimator beneath a target of the second physical vapor deposition gun and above the second portion of the substrate, the second collimator positioned beneath the target of the second physical vapor deposition gun to provide a region for formation of stable plasma between the target and the second collimator, wherein the first collimator and the second collimator are positioned such that the first collimator and the second collimator are external to each other;
- sputtering the at least one material from the first physical vapor deposition gun through the first collimator onto the first portion of the substrate upon application of a first power to the first physical vapor deposition gun to produce a first deposition rate from the first collimator;
- sputtering the at least one material from the second physical vapor deposition gun through the second collimator onto the second portion of the substrate upon application of a second power to the second physical vapor deposition gun to produce a second deposition rate from the second collimator, wherein the sputtering of the at least one material from the second physical vapor deposition gun occurs simultaneously with the sputtering of the at least one material from the first physical vapor deposition gun; and
- replacing at least one of the first collimator or the second collimator with a third collimator having a third set of physical characteristics, the third set of physical characteristics differing from the first set of physical characteristics and the second set of physical characteristics, wherein at least one of the first deposition rate or the second deposition rate is changed upon the replacement of the at least one of the first collimator or the second collimator with the third collimator.

10. The method of claim 9, wherein the first collimator is positioned between approximately 20 mm and 400 mm from the target of the first physical vapor deposition gun.

11. The method of claim 9, further comprising removing the first collimator out of a path between the first physical vapor deposition gun and the substrate, removing the second collimator out of a path between the second physical vapor deposition gun and the substrate, or a combination thereof.

12. The method of claim 9, further comprising sputtering the at least one material from the first physical vapor deposition gun through the first collimator to the substrate at a third deposition rate upon application of a third power to the first physical vapor deposition gun, wherein the third power is at least one of greater than or less than the first power, wherein the third deposition rate is greater than the first deposition rate when the third power is greater than the first power, and wherein the third deposition rate is less than the first deposition rate when the third power is less than the first power.

13. The method of claim 9, wherein the first set of physical characteristics and the second set of physical characteristics comprise the aspect ratio and the aspect ratio of the first collimator and the second collimator is between approximately 0.2 and 20.

14. The method of claim 9, wherein the first set of physical characteristics and the second set of physical characteristics comprise the aperture size and the aperture size of the first collimator and the second collimator includes a diameter of between approximately 2 mm and 200 mm.

15. The method of claim 9, wherein the first portion of the substrate and the second portion of the substrate are external to each other.

16. A method for depositing at least one material on a substrate using physical vapor deposition, the method comprising:
- positioning a first physical vapor deposition gun above a first portion of a substrate;
- positioning a second physical vapor deposition gun above a second portion of the substrate, wherein the first portion of the substrate and the second portion of the substrate are external to each other;
- selecting a first collimator from a plurality of collimators, wherein each collimator of the plurality of collimators has a set of physical characteristics that is different than the respective set of physical characteristics of each of the other collimators of the plurality of collimators, wherein the sets of physical characteristics include at least one of an aspect ratio, an aperture size, an aperture shape, and a texture;
- selecting a second collimator from the plurality of collimators;
- positioning the first collimator between the first physical vapor deposition gun and the first portion of the substrate using a controller;
- positioning the second collimator between the second physical vapor deposition gun and the second portion of the substrate using the controller, wherein the first collimator and the second collimator are positioned such that the first collimator and the second collimator are external to each other;
- sputtering the at least one material from the first physical vapor deposition gun through the first collimator onto the first portion of the substrate upon application of a first power to the first physical vapor deposition gun; and
- sputtering the at least one material from the second physical vapor deposition gun through the second collimator onto the second portion of the substrate upon application of a second power to the second physical vapor deposition gun, wherein the sputtering of the at least one material from the second physical vapor deposition gun occurs simultaneously with the sputtering of the at least one material from the first physical vapor deposition gun.

17. The method of claim 16, wherein the positioning of the first collimator and the positioning of the second collimator is performed with a collimator positioning apparatus in operable communication with the controller.

18. The method of claim 17, wherein the collimator positioning apparatus comprises a pneumatic valve.

* * * * *